(12) United States Patent
Sambonsuge et al.

(10) Patent No.: US 10,090,790 B2
(45) Date of Patent: Oct. 2, 2018

(54) MOTOR CONTROL DEVICE

(71) Applicant: Hitachi Automotive Systems, Ltd., Hitachinaka-shi, Ibaraki (JP)

(72) Inventors: Hirokazu Sambonsuge, Hitachinaka (JP); Kohei Myoen, Hitachinaka (JP); Kazuto Oyama, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/520,746

(22) PCT Filed: Oct. 21, 2015

(86) PCT No.: PCT/JP2015/079627
§ 371 (c)(1),
(2) Date: Apr. 20, 2017

(87) PCT Pub. No.: WO2016/067982
PCT Pub. Date: May 6, 2016

(65) Prior Publication Data
US 2017/0331401 A1    Nov. 16, 2017

(30) Foreign Application Priority Data
Oct. 30, 2014   (JP) ................. 2014-220955

(51) Int. Cl.
*H02P 6/28*      (2016.01)
*G01R 19/15*     (2006.01)
*G01R 35/00*     (2006.01)

(52) U.S. Cl.
CPC ............... *H02P 6/28* (2016.02); *G01R 19/15* (2013.01); *G01R 35/005* (2013.01)

(58) Field of Classification Search
CPC .......... G01R 19/15; G01R 35/005; H02P 6/28
See application file for complete search history.

(56) References Cited

U.S. PATENT DOCUMENTS 6,127,805 A * 10/2000 Kikuchi ............. G01R 31/3624
                                               320/132
2005/0087387 A1   4/2005 Ueda et al.
(Continued)

FOREIGN PATENT DOCUMENTS

JP        9-70196 A      3/1997
JP     2005-130570 A     5/2005
(Continued)

OTHER PUBLICATIONS

International Search Report (PCT/ISA/210) issued in counterpart Japanese Application No. PCT/JP2015/079627 dated Feb. 9, 2016 with English translation (five (5) pages).
(Continued)

*Primary Examiner* — Muhammad S Islam
(74) *Attorney, Agent, or Firm* — Crowell & Moring LLP (57) ABSTRACT

The occurrence of torque in the motor due to an unintentional flow of the q-axis current in the motor during discharging of the smoothing capacitor is reduced. A motor control device according to the present invention controls a system including an inverter including a smoothing capacitor connected to a power source via a relay, a motor connected to the inverter, and a current sensor configured to detect a current flowing through the motor, the motor control device including: an electric discharge control unit configured to discharge, in the motor via the inverter, an electric charge accumulated in the smoothing capacitor; and a current sensor calibration unit configured to calibrate the current sensor in a state where no current in the motor flows during a time period from when the relay is cut off to when discharge control by the electric discharge control unit is started, wherein the electric discharge control unit performs discharge by controlling the current in the motor based on a
(Continued)

value of the current sensor calibrated by the current sensor calibration unit.

2 Claims, 7 Drawing Sheets

(56) References Cited

U.S. PATENT DOCUMENTS

2008/0002322 A1\* 1/2008 Hirasawa ............. B60L 3/0046
361/79
2010/0294586 A1 11/2010 Nagase et al.
2013/0154526 A1 6/2013 Choi

FOREIGN PATENT DOCUMENTS

JP 2008-94342 A 4/2008
JP 2013-128403 A 6/2013

OTHER PUBLICATIONS

Japanese-language Written Opinion (PCT/ISA/237) issued in PCT Application No. PCT/JP2015/079627 dated Feb. 9, 2016 (four (4) pages).

\* cited by examiner

MOTOR CONTROL DEVICE

TECHNICAL FIELD

The present invention relates to a motor control device.

BACKGROUND ART

In a system for converting an output from a power source into an AC voltage by an inverter and driving the motor, the inverter has as element for performing switching at high speed in order to control the voltage applied to the motor. A smoothing capacitor is arranged between the inverter and the power source in order to smooth the voltage fluctuating by this switching. A relay is provided between the power source and the inverter in order to open and close the connection between them.

When the motor is driven, the voltage of a smoothing capacitor approximately equals the power source voltage, and in the case of a hybrid vehicle or an electric vehicle, the voltage becomes several hundreds of volts. In the maintenance, inspection and repair of the inverter, it is necessary to discharge the electric charge of the smoothing capacitor quickly after opening the relay so that their work can he performed safely.

PTL 1 suggests a method of discharging the electric charge of the smoothing capacitor by supplying a current to the motor. The current supplied to the motor is controlled so that the d-axis current whose direction is a direction of the magnetic flux of the motor and which excite the motor together with the permanent magnets for motor excitation is made non-zero and the q-axis current which comes directly to the d-axis and that imparts torque to the motor is made zero. The current supplied to the motor is determined by a feedback control that operates so that the difference between the current value flowing through the motor detected by the current sensor and the target current value approaches zero.

As a result, the current can be supposed to the motor without generating torque in the motor, and electric power is consumed by the impedance of the winding, so that the electric charge of the smoothing capacitor is discharged.

However, when there is a detection error in the current sensor for detecting the motor current, an unintentional current may flow to the motor. The unintentional current is a current where the q-axis current is non-zero. When the q-axis current flows, torque is generated in the motor, and the motor may rotate.

CITATION LIST

Patent Literature

PTL 1: JP H9-70196 A

SUMMARY OF INVENTION

Technical Problem

A problem to be solved by the present invention is to reduce the occurrence of torque in the motor due to unintended of the q-axis current of the motor during (discharging of the smoothing capacitor.

Solution to Problem

In order to solve the above issue, a motor control device according to the present invention controls a system including an inverter including a smoothing capacitor connected to a power source via a relay, a motor connected to the inverter, and a current sensor configured to detect a current flowing through the motor, the motor control device including: an electric discharge control unit configured to discharge, in the motor via the inverter, as electric charge accumulated in the smoothing capacitor; and a current sensor calibration unit configured to calibrate the current sensor in a state where no current in the motor flows during a time period from when the relay is cut off to when discharge control by the electric discharge control unit is started, wherein the electric discharge control unit performs discharge by controlling the current in the motor based on a value of the current sensor calibrated by the current sensor calibration unit.

Advantageous Effects of Invention

The present invention makes it possible to reduce the generation of torque in the motor at the time of discharging the smoothing capacitor, and to improve reliability.

DESCRIPTION OF EMBODIMENTS

Embodiments of the present invention will be described with reference to drawings.

First Embodiment

Figure 1:
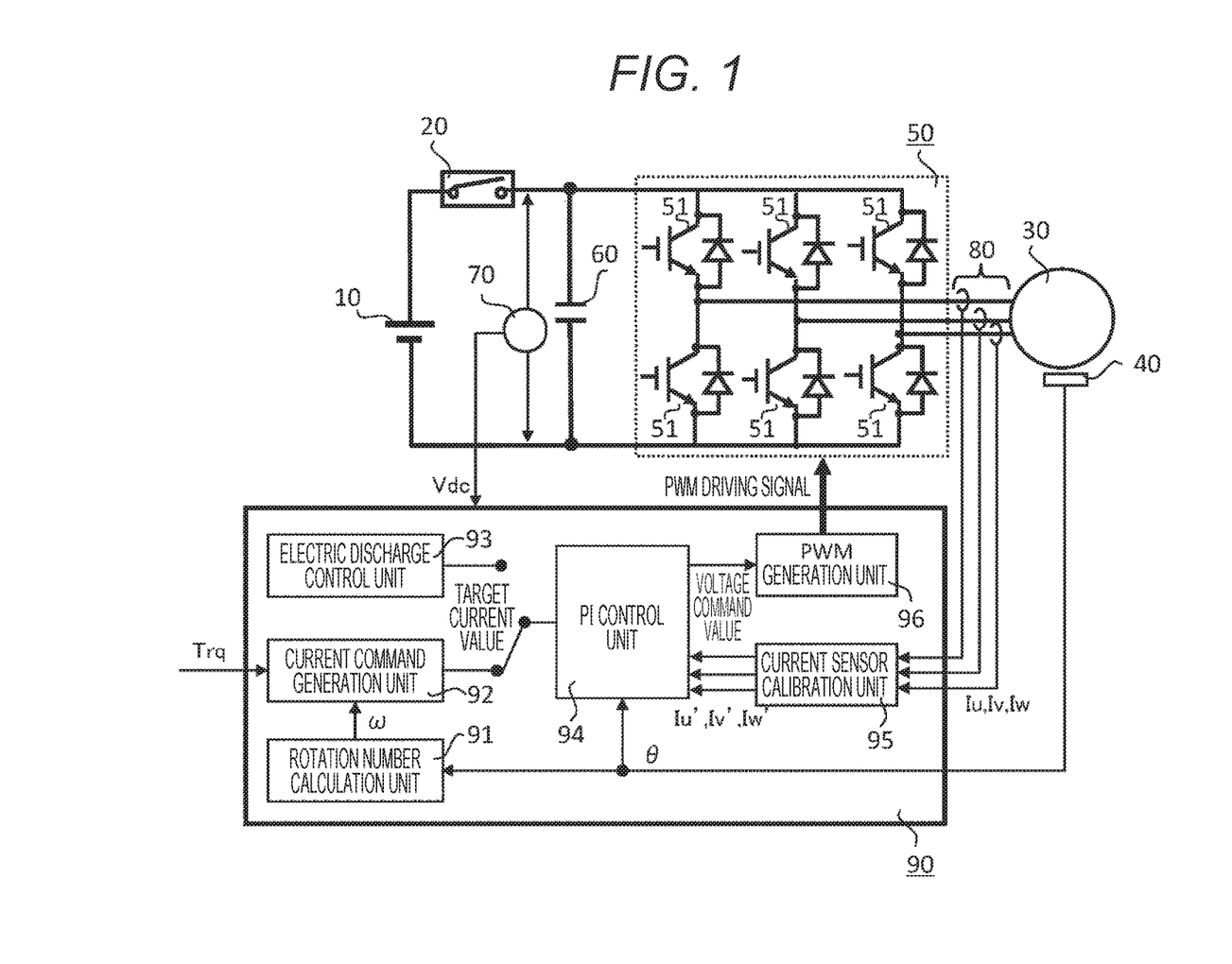
FIG. 1 is a view showing an outline of a motor control system including a power source, a motor, and a device for performing an electric discharge processing of a smoothing capacitor in a first embodiment of the present invention.

FIG. 1 is a view shoving an outline of a motor control system including a power source, a motor, and a device for performing an electric discharge processing of a smoothing capacitor in a first embodiment of the present invention.

The motor control system includes a power source 10, a relay 20, a motor 30, a magnetic pole position detection circuit 40 of the motor 30, an inverter 50, a smoothing capacitor 60, a voltage detection circuit 70 of the smoothing capacitor 60, a current sensor 80 between the motor 30 and the inverter 50, and a control device 90.

The power source 10 is a DC power source of several hundreds of volts, and a nickel hydrogen. battery or a lithium-ion battery is used as the power source. The relay 20 is disposed between the power source 10 and the inverter 50. When the relay 20 is in the open state, the power source 10 and the inverter 50 are electrically disconnected. When the relay 20 is in the closed state, the power source 10 and the inverter 50 are electrically connected, and the power of the power source 10 is supplied to the inverter 50.

The smoothing capacitor 60 smooths the output of the power source 10, and when the relay 20 is in the closed state, the smoothing capacitor 60 has substantially the same voltage as the power source 10. The voltage value Vdc of the smoothing capacitor 60 is detected by the voltage detection circuit 70 and transmitted to the control device 90.

The inverter 50 incorporates switching element parts 51 (for example, IGBT and diode) that perform a plurality of switching operations, and converts electric power from the power source 10 from direct current to three-phase alternating current. The switching element parts 51 incorporated in the inverter 50 are provided for three phases on each of the positive side and the negative side of the power source 10, and the pulse-width modulation can be employed in which a pulse width of the voltage generated by the switching of the total of six elements is changed, and a predetermined voltage is applied to the motor 30.

The motor 30 is composed of two components, which are a stator having three phases (in this case, U phase, V phase, W phase) windings, and a rotor where torque is generated by magnetic flux which changes as the current flows through the windings. The current flowing through the motor 30 is detected by the current sensor 80 and transmitted to the current sensor calibration unit 95. The current values Iu, Iv, Iw detected by the current sensor 80 include a detection error of the current sensor called an offset error.

The magnetic pole position detection circuit 40 detects a magnetic pole position θ, which changes according to the rotation of the rotor of the motor 30, and information on the magnetic pole position θ is transmitted to a rotation number calculation unit 91 and a PI control unit 94.

The control device 90 includes the rotation number calculation unit 91, a current command generation unit 92, an electric discharge control unit 93, the PI control unit 94, a current sensor calibration unit 95, and a PWM generation unit 96, and receives a torque command Trq from the outside, and controls the current supplied to the motor 30.

The rotation number calculation unit 91 receives the magnetic pole position θ from the magnetic pole position detection circuit 40, and generates the motor rotation number ω from the amount of the change the magnetic pole position θ.

Based on the torque command Trq received from the outside, the current command generation unit 92 generates target current values of the d axis and the q axis according to the motor rotation number ω and the smoothing capacitor voltage Vdc of the smoothing capacitor 60 so as to output the designated torque.

The current sensor calibration unit 95 calibrates the detection error caused by the offset error of the current sensor 80 with respect to the current values Iu, Iv, and Iw detected by the current sensor 80. The calibrated current values Iu', Iv', and Iw' calibrated by the current sensor calibration unit 95 are used by the PI control unit 94.

The PI control unit 94 compares the d-axis and q-axis target current values, and current values determined by converting the calibrated current values Iu', Iv', and Iw' into the d-axis current and q-axis current, and performs PI calculation with respect to the difference to generate a voltage command value.

Based on the voltage command value and the smoothing capacitor voltage Vdc, the PWM generation unit 96 generates a PWM driving signal for on/off controlling the switching element parts 51.

[Outline of Electric Discharge Processing]

The electric discharge control unit 93 outputs target current values of the d axis and the q axis necessary for discharge by windings of the motor 30. When the relay 20 is in the open state and performs electric discharge processing of the smoothing capacitor 60, the electric discharge control unit 93 performs a switching operation so that the target current value outputted from the electric discharge control unit 93 is input to the PI control unit 94.

Figure 2:
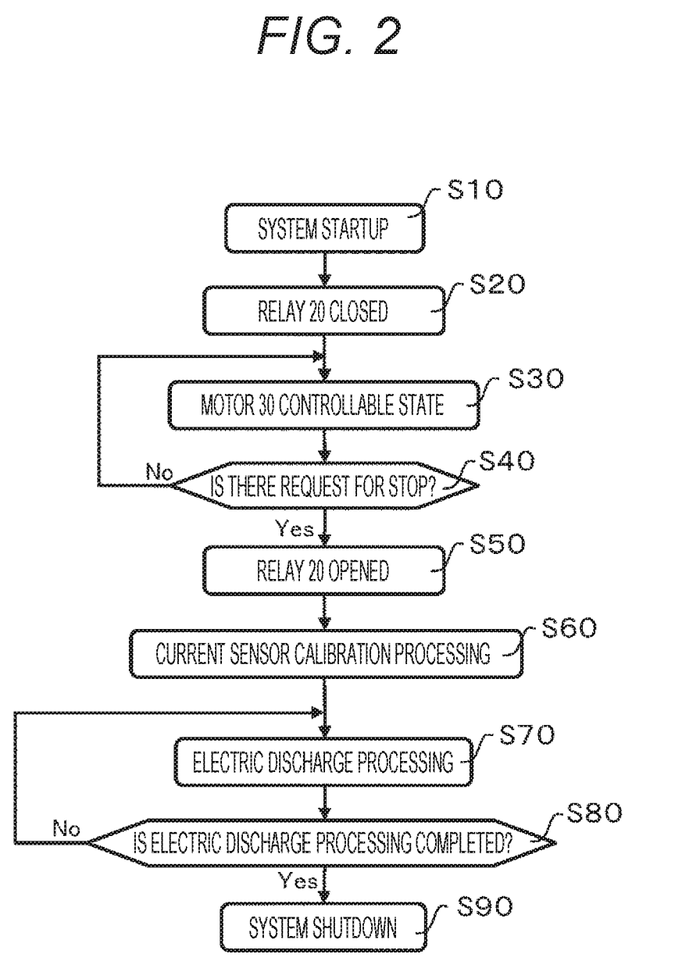
FIG. 2 is a flowchart describing a flow from startup to stop of a control device 90.

FIG. 2 is a flowchart describing a flow from startup to stop of a control device 90.

When the system is started in step 10, the relay 20 is closed in step 20, the power source 10 and the inverter 50 are connected, and voltage is applied to the smoothing capacitor 60.

When preparations for controlling the motor 30 are completed, the process proceeds to step 30, and the motor 30 can be controlled. The control device 90 calculates the voltage command value from the target torque command and control s the output of the PWM driving signal.

When the request for stop to the system is confirmed in step 40, the output of the PWM driving signal is stopped, the relay 20 is opened in step 50, and the power source 10 and the inverter 50 are electrically disconnected.

In the state where the relay 20 is in the open state and the current flowing to the motor 30 becomes zero, the current sensor calibration processing in step 60 is performed. In the current sensor calibration processing, the current sensor detection value in a state where the current is zero is kept as an offset error calibration value.

The current sensor calibration unit 95 calibrates the detection error caused b the offset error by subtracting the offset error calibration value which the current sensor calibration unit 95 acquires from the current values Iu, Iv, and Iw detected by the current sensor 80.

Next, in order to discharge the electric charge remaining in the smoothing capacitor 60, electric discharge processing in step 70 is performed. When the smoothing capacitor voltage Vdc becomes lower than the predetermined value by the electric discharge processing, completion of the electric discharge processing is confirmed in step 80, and the system stops in step 90.

Figure 3:
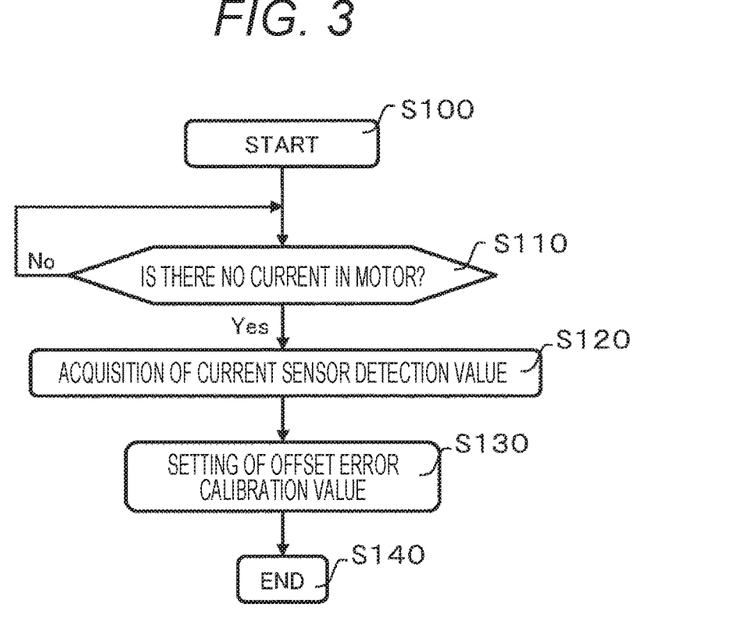
FIG. 3 is a flowchart illustrating a flow of a current sensor calibration processing which is performed prior to an electric discharge processing when the relay 20 of the motor control system is in an open state.

Details of the current sensor calibration processing will be described with reference to the flowchart of FIG. 3. FIG. 3 is a flowchart describing he flow of the current sensor calibration processing which is performed prior to the electric discharge processing when the relay 20 of the motor control system is in the open state.

In step 100, the current sensor calibration processing is started. In step 110, the current sensor calibration unit 95 determines the state of the current of the motor 30. When it is determined that no current is flowing, the current sensor calibration value is acquired in step 120.

In step 130, the current sensor calibration unit 95 sets the current sensor detection value acquired in step 120 as an offset error calibration value. While the motor control system is running, the current sensor calibration unit 95 subtracts the offset error calibration value from the current sensor detection value, thereby generating calibrated current values Iu', Iv', Iw', which are values after the offset error is calibrated. The initial value of the offset error calibration value is 0, and is updated every time the current sensor calibration processing is executed.

Figure 4:
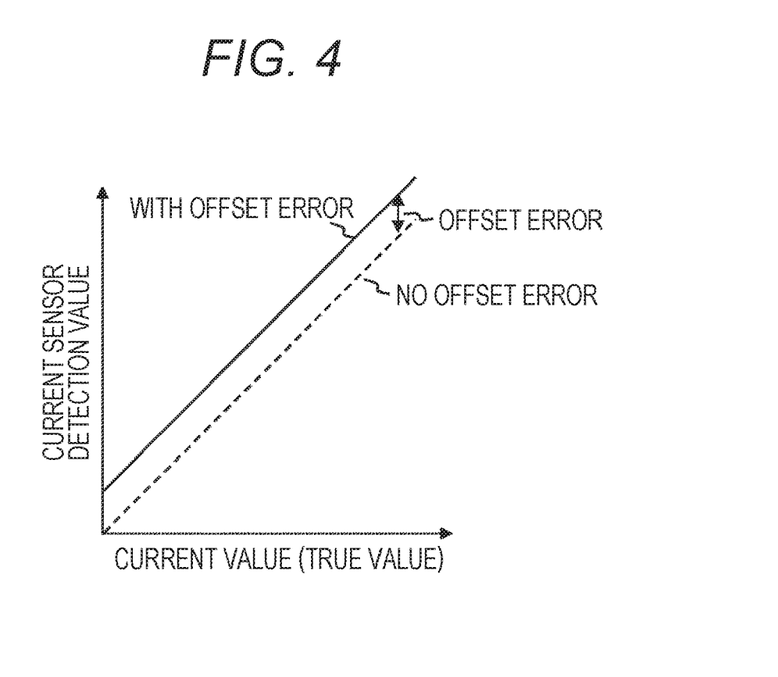
FIG. 4 is a graph showing a relation between a current sensor detection value and an offset error included in a detection value with respect to a current value (true value).

FIG. 4 is a graph showing a relation between a current sensor detection value and an offset error included in a detection value with respect to a current value (true value).

For the current sensor detection value, a detection error called an offset error is added to a current value (true value) which is the amount of current actually flowing. The offset error is a constant value regardless of the magnitude of the current value (true value). The magnitude of the offset error varies depending on the individual difference among current sensors.

[Calculation Method of Current Sensor Offset Error]

Figure 5:
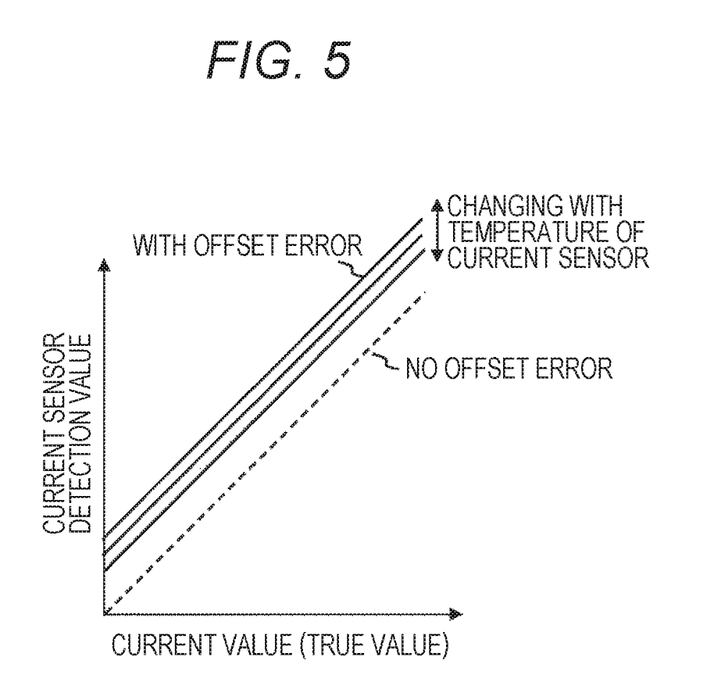
FIG. 5 is a graph showing a current sensor detection value and a temperature characteristic of an offset error with respect to a current value (true value).

From these relations, the offset error of the current sensor 80 is the same as the current sensor detection value in the state where the current value (true value) is zero, that is, the current does not flow. FIG. 5 is a graph showing a current sensor detection value and a temperature characteristic of an offset error with respect to a current value (true value). The offset error has the characteristic of changing according to the temperature of the current sensor (temperature characteristic).

Figure 6:
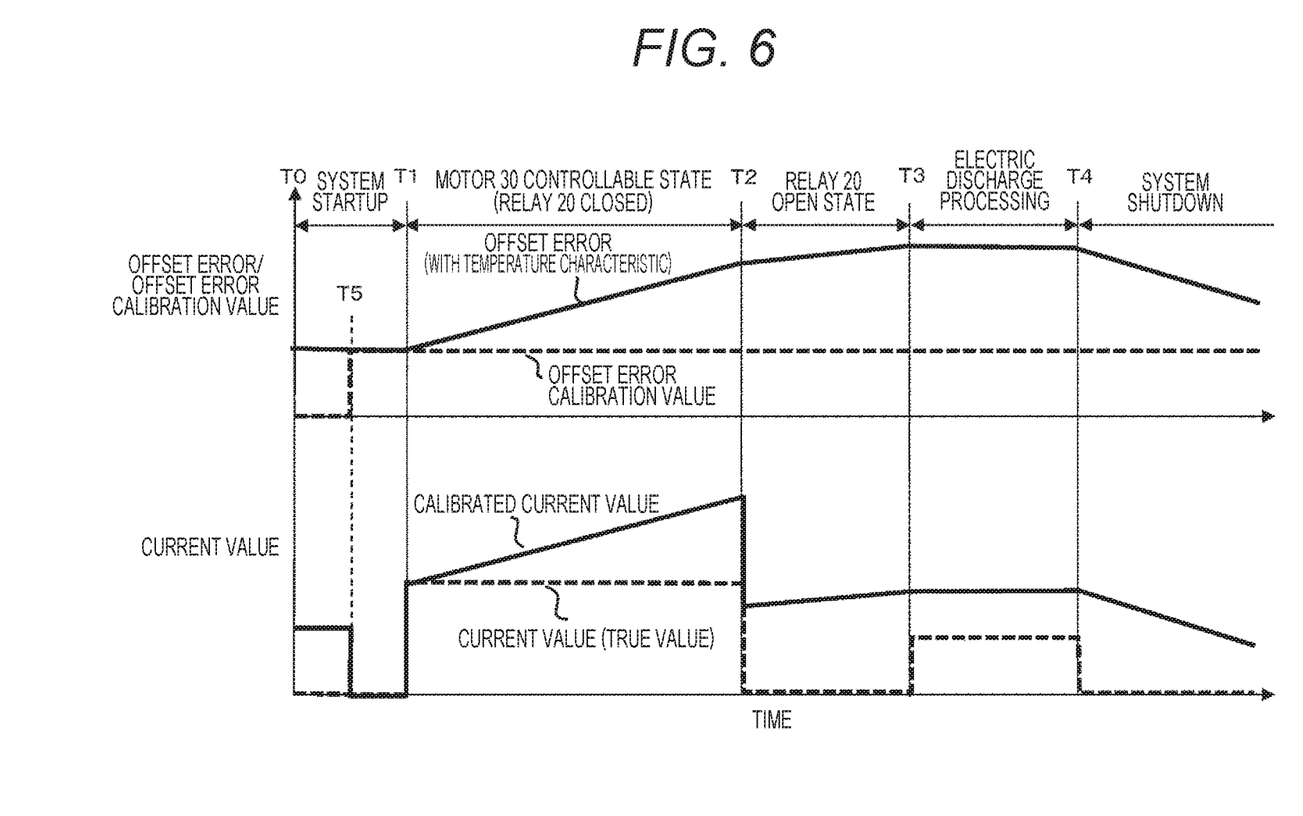
FIG. 6 is a graph showing an offset error (with temperature characteristic), an offset error calibration value, a current value (true value), and a calibrated current value from startup to shutdown of the system when the current sensor calibration processing is executed at the system startup.

FIG. 6 is a graph showing an offset error (with temperature characteristic), an offset error calibration value, a current value (true value), and a calibrated current value from startup to shutdown of the system when the current sensor calibration processing is executed at the system startup. Here, a current sensor having a larger offset error as the temperature increases will be described.

The temperature of the current sensor 80 increases gradually from the start of the controllable state of the motor 30 (time T1), and the temperature at the start of electric discharge processing time T3) is higher than that at the system start time (time T0 to time T1). The offset error like the current sensor temperature gradually increases from the time T1.

Here, when the current sensor calibration processing is executed at time T5, the offset error calibration value becomes the same as that of the offset error (with temperature characteristic) at time T5. The relation between the current value (true value) and the calibrated current value is shown in the lower part of FIG. 6.

At time T0, the offset error calibration value is set and the calibrated current value becomes the same as the current value (true value). The offset error at time T3 when the electric discharge processing is started becomes larger than that at time T5 as the current sensor temperature increases.

As a result, there is a difference between the calibrated current value and the current value (true value) at the start of the electric discharge processing (time T3), and an unintended current may flow in the motor, generating torque.

Figure 7:
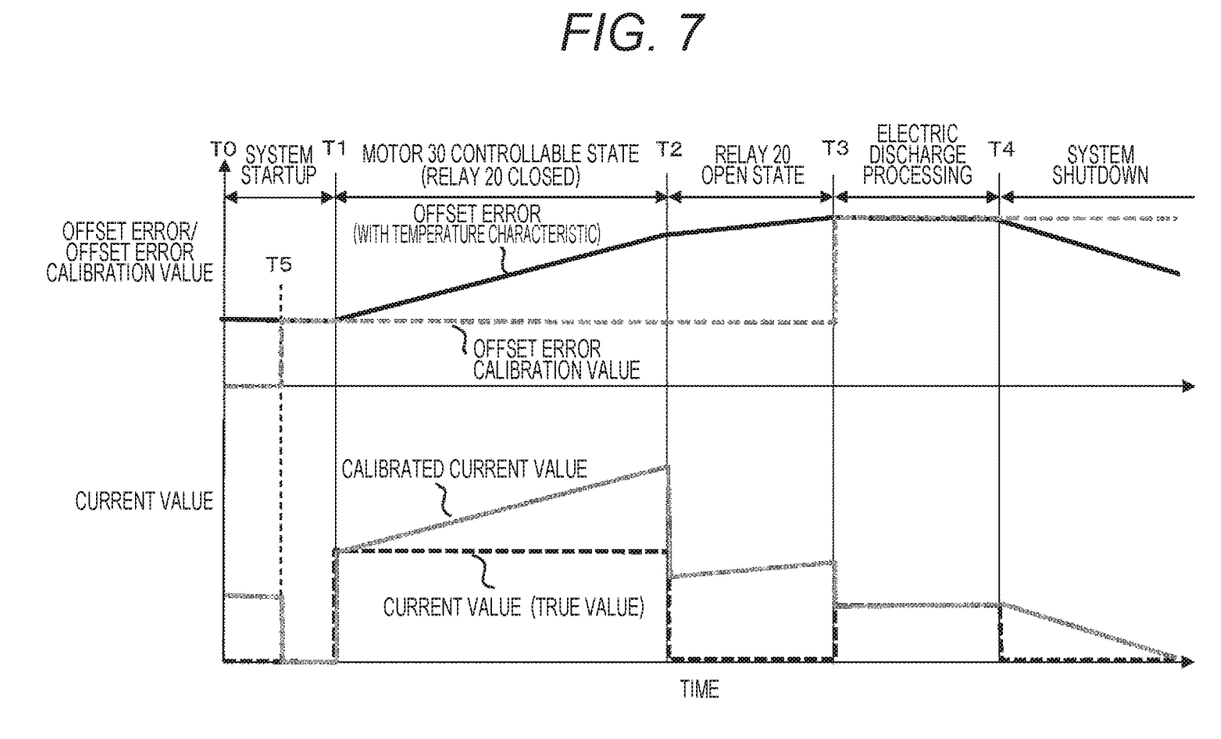
FIG. 7 is a graph showing an offset error (with temperature characteristic), an offset error calibration value, a current value (true value), and a calibrated current value from startup to shutdown of the system when the current sensor calibration processing is executed immediately before the electric discharge processing is started.

FIG. 7 is a graph showing an offset error (with temperature characteristic), an offset error calibration value, a current value (true value), and a calibrated current value from startup to shutdown of the system when the current sensor calibration processing is executed just before the electric discharge processing is started.

By performing the current sensor calibration processing immediately before the start of the electric discharge process (time T3), an offset error can be calibrated with respect to the current sensor temperature, which is substantially the same as at the time of the electric discharge processing.

As a result, the calibrated current value becomes substantially the same as the current value (true value) at the time of electric discharge start (time T3), and this can prevent an unintentional current from flowing to the motor 30 by electric discharge processing.

SECOND EXAMPLE

Figure 8:
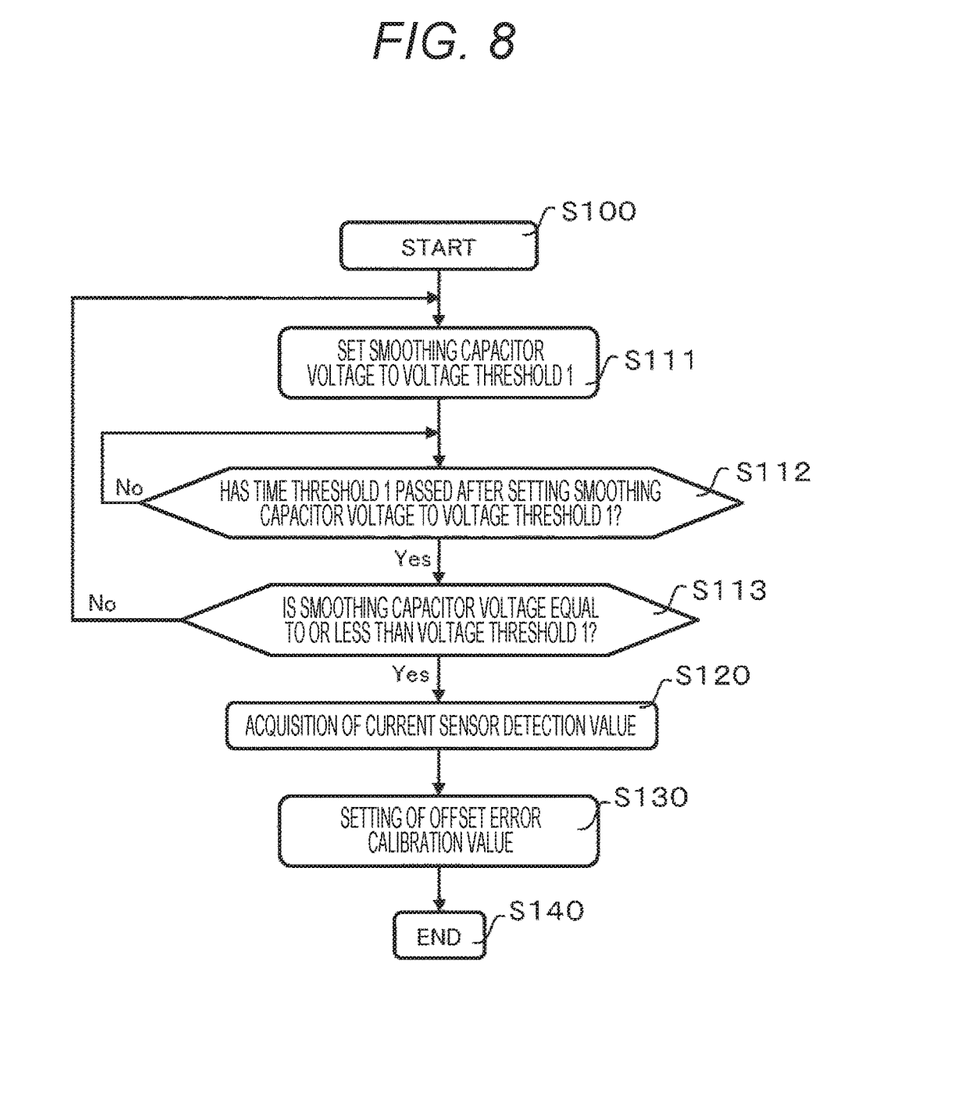
FIG. 8 is a flowchart describing a flow of a current sensor calibration processing which is performed prior to the electric discharge processing when a relay 20 of the motor control device is in the open state in a second embodiment of the present invention.

FIG. 8 is a flowchart describing a flow of a current sensor calibration processing which is performed prior to the electric discharge processing when a relay 20 of the motor control device is in the open state in a second embodiment of the present invention.

In step 100, when the current sensor calibration processing is started, in step 111, the smoothing capacitor voltage is set to the voltage threshold 1.

In step 112, if it is determined that the elapsed time after the execution of step 111 has passed the time threshold 1, the process proceeds to step 113.

If determined in step 113 that the smoothing capacitor voltage Vdc is equal to or less than the voltage threshold 1, the process proceeds to step 120. If it is determined that the smoothing capacitor voltage Vdc is more than the voltage threshold 1, the process proceeds to step 111, where the voltage threshold 1 is updated by the current smoothing capacitor voltage Vdc.

In step 120, the detection value of the current sensor is acquired. In step 130, the current sensor calibration unit 95 sets the current sensor detect on value acquired in step 120 as an offset error calibration value.

While the motor control device is running, the current sensor calibration unit 95 subtracts the offset error calibration value from the current sensor detection value, thereby generating calibrated current values Iu', Iv', Iw', which are values after the offset error is calibrated. The initial value of the offset error calibration value is 0, and is updated every time the current sensor calibration processing is executed.

The offset error calibration of the current sensor by the current sensor calibration unit 95 shown in FIG. 1 is determined on the premise that no current flows between the inverter 50 and the motor 30. The control device 90 controls the inverter 50 not to pass the electric current to the motor 30 until the start of electric discharge processing alter shut off of the relay That is, he switching element parts 51 of the inverter 50 are not performing a switching operation.

However, when an induced voltage is generated in the motor 30 in a state where the motor 30 is still rotating while the relay 20 is in the open state, the current passes through the diode of the switching element parts 51 of the inverter 50 and flows to the smoothing capacitor 60, depending on the magnitude of the smoothing capacitor voltage value Vdc. As a result, the smoothing capacitor voltage Vdc increases.

Therefore, as shown in step 113 in FIG. 8, the current sensor calibration unit 95 performs the current sensor calibration processing when determining that the smoothing capacitor voltage Vdc has not increased.

When it is determined that the smoothing capacitor voltage Vdc has not increased, increase in voltage due to the induced voltage of the motor 30 has not occurred. That is, no current flows from the motor 30 to the smoothing capacitor 60 via the inverter 50. As a result, determining the increase the smoothing capacitor voltage Vdc can determine whether or not the current sensor calibration should be performed.

REFERENCE SIGNS LIST 10 power source
20 relay 30 motor
40 magnetic pole position detection circuit
50 inverter
51 switching element part
60 smoothing capacitor
70 voltage detection circuit
80 current sensor
90 control device
91 rotation number calculation unit
92 current command generation unit
93 electric discharge control unit
PI control unit
95 current sensor calibration unit
Iu, Iv, Iw current value
Iu', Iv', Iw' calibrated current value
96 PWM generation unit
Vdc smoothing capacitor voltage
Trq torque command
θ magnetic pole position
ω motor rotation number

The invention claimed is:

1. A motor control device that controls a system, the system including an inverter including a smoothing capacitor connected to a power source via a relay, a motor connected to the inverter, and a current sensor configured to detect a current flowing through the motor, the motor control device comprising:

an electric discharge control unit configured to discharge, in the motor via the inverter, an electric charge accumulated in the smoothing capacitor; and a current sensor calibration unit configured to calibrate the current sensor in a state where no current in the motor flows during a time period from when the relay is cut off to when discharge control by the electric discharge control unit is started, wherein the electric discharge control unit performs discharge by controlling the current in the motor based on a value of the current sensor calibrated by the current sensor calibration unit.

2. The motor control device according to claim 1, wherein the current sensor calibration unit detects a state in which no current flows to the motor by determining a voltage change of the smoothing capacitor.

* * * * *